(12) United States Patent
Sakimura et al.

(10) Patent No.: US 9,299,435 B2
(45) Date of Patent: Mar. 29, 2016

(54) NONVOLATILE CONTENT ADDRESSABLE MEMORY AND METHOD FOR OPERATING SAME

(71) Applicants: NEC CORPORATION, Tokyo (JP); TOHOKU UNIVERSITY, Sendai-shi, Miyagi (JP)

(72) Inventors: Noboru Sakimura, Tokyo (JP); Ryusuke Nebashi, Tokyo (JP); Tadahiko Sugibayashi, Tokyo (JP); Shoun Matsunaga, Miyagi (JP); Takahiro Hanyu, Miyagi (JP); Hideo Ohno, Miyagi (JP)

(73) Assignees: NEC CORPORATION, Tokyo (JP); TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 14/423,321

(22) PCT Filed: Aug. 1, 2013

(86) PCT No.: PCT/JP2013/071442
§ 371 (c)(1),
(2) Date: Feb. 23, 2015

(87) PCT Pub. No.: WO2014/038340
PCT Pub. Date: Mar. 13, 2014

(65) Prior Publication Data
US 2015/0235703 A1 Aug. 20, 2015

(30) Foreign Application Priority Data
Sep. 6, 2012 (JP) .................................. 2012-195959

(51) Int. Cl.
*G11C 15/04* (2006.01)

(52) U.S. Cl.
CPC .............. *G11C 15/04* (2013.01); *G11C 15/046* (2013.01)

(58) Field of Classification Search
CPC .............................. G11C 15/04; G11C 15/046
See application file for complete search history.

(56) References Cited

FOREIGN PATENT DOCUMENTS

| JP | 59-116992 A | 7/1984 |
|----|----|----|
| JP | 62-293596 A | 12/1987 |
| JP | 63-31091 A | 2/1988 |
| JP | 02-308499 A | 12/1990 |
| JP | 04-186596 A | 7/1992 |
| JP | 11-86567 A | 3/1999 |
| JP | 2012-190530 A | 10/2012 |

(Continued)

OTHER PUBLICATIONS

Kostas Pagiamtzis et al., "Content-Addressable Memory (CAM) Circuits and Architectures: A Tutorial and Survey", IEEE Journal of Solid-State Circuits, Mar. 2006, pp. 712-727, vol. 41, No. 3.

(Continued)

*Primary Examiner* — Richard Elms
*Assistant Examiner* — Ajay Ojha
(74) *Attorney, Agent, or Firm* — Sughrue Mion, PLLC (57) ABSTRACT

Provided is a nonvolatile content addressable memory. Each word circuit includes a plurality of segments having an order relation. Each of the segments includes one or more memory cells. Each of the memory cells includes a nonvolatile storage element. Each of the segments includes a power switch for turning on/off a power of a memory cell of the segment. During stand-by, all the power switches are turned off, and, in search operation, the power switch is turned on as necessary for each of the segments.

18 Claims, 10 Drawing Sheets

(56) References Cited

FOREIGN PATENT DOCUMENTS

| JP | 2013-200920 A | 10/2013 |
| WO | 02/056315 A1 | 7/2002 |

OTHER PUBLICATIONS

International Search Report of PCT/JP2013/071442 dated Nov. 5, 2013 [PCT/ISA/210].
Written Opinion of PCT/JP2013/071442 dated Nov. 5, 2013 [PCT/ISA/237].

| Search data | Storage data | SL, /SL | | Rj, Rjb | | ML |
|---|---|---|---|---|---|---|
| 0 | 0 | L | H | $R_L$ | $R_H$ | H (Match) |
| 0 | 1 | L | H | $R_H$ | $R_L$ | L (Mismatch) |
| 1 | 0 | H | L | $R_L$ | $R_H$ | L (Mismatch) |
| 1 | 1 | H | L | $R_H$ | $R_L$ | H (Match) |
| 0/1 | X | L/H | H/L | $R_H$ | $R_H$ | H (Match) |
| 0/1 | Miss | L/H | H/L | $R_L$ | $R_L$ | L (Mismatch) |
| X | 0/1 | L | L | $R_L/R_H$ | $R_L/R_H$ | H (Match) |

NONVOLATILE CONTENT ADDRESSABLE MEMORY AND METHOD FOR OPERATING SAME

CROSS REFERENCE TO RELATED APPLICATIONS

This application is a National Stage of International Application No. PCT/JP 2013/071442, filed Aug. 1, 2013, claiming priority based on Japanese Patent Application No. 2012-195959, filed Sep. 6, 2012, the contents of all of which are incorporated herein by reference in their entirety.

TECHNICAL FIELD

This invention relates to a content addressable memory (CAM). More particularly, this invention relates to a CAM that uses a nonvolatile storage element as a storage element.

BACKGROUND ART

A CAM compares input data (search data) with stored data, and outputs an address of matched stored data. In general, a CAM carries out this comparing operation in parallel for all the stored data, and thus, data can be searched at high speed. A CAM having such a function is used in a wide range of fields, and, for example, used in a network router or a cache memory.

As a storage element of a CAM, a CAM cell based on a static random access memory (SRAM) is widely known. As CAM cells, one that can store two logic states of "0" and "1" and one that can store three logic states of "0", "1", and "X" are known. The former is referred to simply as a CAM cell or a binary CAM cell, and the latter is also referred to as a ternary CAM (TCAM) cell. A bit in the "X" state means "Don't care", and, regardless of whether "0" is input or "1" is input as the search data, the data is regarded as matched.

Those CAM cells based on an SRAM can search data at high speed, for example, in several nanoseconds. On the other hand, in the search operation, all the storage words are required to be activated with regard to an input search word and are required to be bit-compared, and thus, operating power is very high.

As a method of reducing power consumption of the CAM in the search operation, in Non Patent Document 1, there is disclosed a method in which search operation is divided into several cycles to be carried out in a pipeline manner, and, with regard to a word that is determined to be mismatched earlier, no more bit comparison is made. According to this method, a CAM cell array including a plurality of word circuits each having an n-bit CAM cell is divided into several segments, and bit comparison is made for each segment. With regard to a word that is determined to be matched earlier, bit-comparing operation in the next segment is activated. On the other hand, with regard to a word that is determined to be mismatched, bit-comparing operation in the next segment is not carried out. By repeating sequentially the operation described above, useless bit search operation can be eliminated. Although time necessary for the search operation increases, the operating power can be significantly lowered.

PRIOR ART DOCUMENT

Non Patent Document

Non Patent Document 1: "Content-Addressable Memory (CAM) Circuits and Architectures: A Tutorial and Survey" (IEEE Journal of Solid-State Circuits, Vol. 41, No. 3, March, 2006

SUMMARY OF THE INVENTION

Problem to be Solved by the Invention

According to the related-art SRAM-based CAM described in Non Patent Document 1, it is necessary to keep the power on for the purpose of holding storage data (searched data) even during a time period in which search operation is unnecessary.

A typical SRAM-based CAM cell includes an SRAM cell for holding storage data. A binary CAM cell needs one SRAM cell, and a TCAM cell needs two SRAM cells. Leakage current consumed in each SRAM for holding data is small in quantity, but a large number of CAM cells are two-dimensionally arranged, and thus, the leakage current is a main cause of a large stand-by current.

As another method of reducing power consumption of the CAM in the search operation, a method in which power to the CAM is shut off during non-operation is conceivable. However, an SRAM-based CAM cell is volatile, and thus, if the power is shut off, the searched data is lost. This situation can be avoided by, immediately before power to the CAM is shut off, transferring and storing all the searched data to and in a storage device additionally provided. However, data transfer between the CAM and the storage device is necessary every time the power is shut off and turned on. Such data transfer causes waiting time, which impairs convenience. Further, overhead of power consumption for the data transfer occurs, and complexity of power on/off control increases, and thus, application of this method is limited.

This invention has been made in view of the above, and an object to be achieved by this invention is to provide a nonvolatile content addressable memory with reduced power consumption.

Means to Solve the Problem

In order to solve the problem described above, according to one aspect of this invention, there is provided a nonvolatile content addressable memory configured to compare search data that is input from an outside with storage data that is stored in advance, the nonvolatile content addressable memory including a plurality of word circuits, each of the plurality of word circuits including a plurality of segments having an order relation, each of the plurality of segments including one or more memory cells, each of the one or more memory cells including a nonvolatile storage element, the each of the plurality of segments including power switch means for turning on/off a power of a memory cell of segment, in which, during stand-by, all the power switch means are turned off, and in which, in search operation, the power switch means is turned on as necessary for each of the plurality of segments.

Further, according to another aspect of this invention, there is provided a method of operating a nonvolatile content addressable memory configured to compare search data that is input from an outside with storage data that is stored in advance, the method including, when each of a plurality of word circuits included in the nonvolatile content addressable memory is divided into a plurality of segments each including one or more memory cells and having an order relation in each of the plurality of word circuits: a stand-by step of turning off all powers of the plurality of segments during stand-by; and a searching step of turning on the power as necessary for each of the plurality of segments in search operation.

Effect of the Invention

The nonvolatile content addressable memory according to one aspect of this invention can reduce power consumption in search operation.

MODES FOR EMBODYING THE INVENTION

Embodiments of this invention are specifically described in detail in the following with reference to the drawings. Note that, in those embodiments, for the sake of convenience of description, no discrimination is made between a binary CAM and a ternary CAM, and the two are collectively referred to simply as a CAM.
(First Embodiment)

Figure 1:
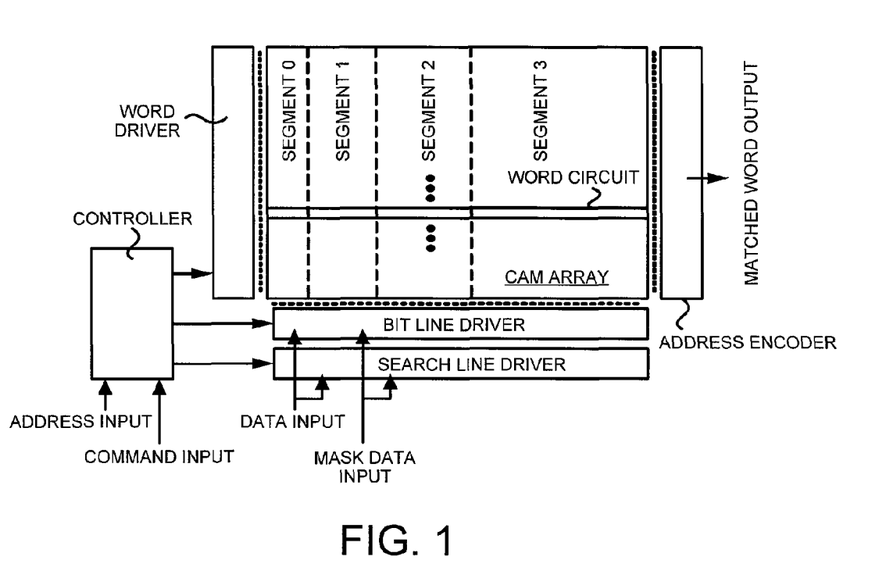
FIG. 1 is a block diagram schematically illustrating a structure of a nonvolatile CAM according to an embodiment of this invention.

FIG. 1 is a block diagram schematically illustrating a structure of a nonvolatile CAM according to this embodiment. The nonvolatile CAM according to this embodiment includes a CAM array, and a word line driver, a sense amplifier, an address encoder, a bit line driver, a search line driver, and a controller, all provided on the periphery of the CAM array.

Figure 2:
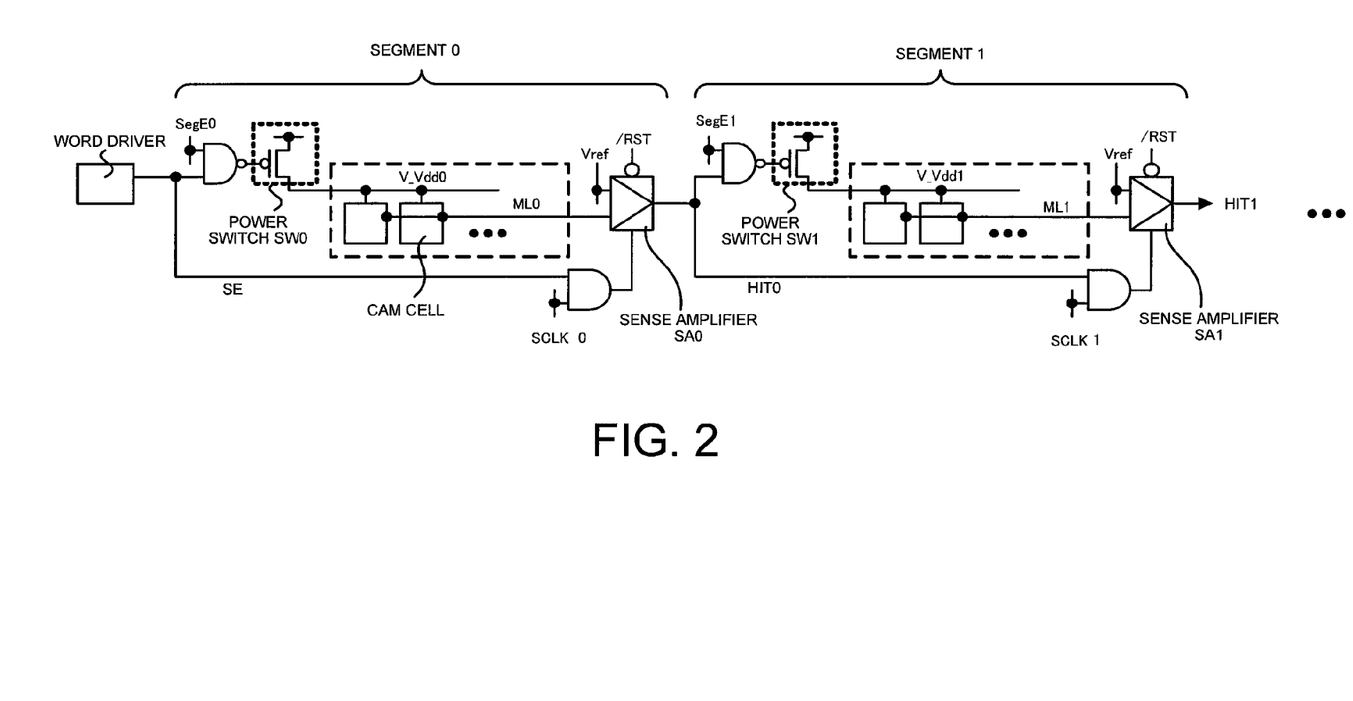
FIG. 2 is a block diagram illustrating a structure of a word circuit in the nonvolatile CAM according to the embodiment of this invention.

The CAM array includes a plurality of word circuits arranged in a line in an X direction, each of which is further divided into a plurality of segments. Specifically, as illustrated in FIG. 2, each of the word circuits is divided into a plurality of segments of Segment 0, Segment 1, .... Each of the segments includes a plurality of CAM cells, a power switch, and a sense amplifier.

In this case, the power switch has the function of turning on/off power (V_Vdd) of all the CAM cells in the segment. A power switch SW0 collectively turns on/off power V_Vdd0 of all the CAM cells in Segment 0. Similarly, a power switch SW1 collectively turns on/off power V_Vdd1 of all the CAM cells in Segment 1. The same holds true for power switches SW2, SW3, ... of other segments (not shown).

The sense amplifier has the function of comparing a voltage at a match line (ML) in the segment with a reference voltage Vref and amplifying the result to have a logical amplitude. Specifically, when the voltage at the match line is higher than the reference voltage, a HIGH level (corresponding to "matched") is output, and, when the voltage is lower than the reference voltage, a LOW level (corresponding to "mismatched") is output. This amplifying operation is carried out in synchronization with a clock signal SCLK. Specifically, a sense amplifier SA0 compares a voltage at a match line ML0 in Segment 0 with the reference voltage Vref, and, when the voltage at the match line ML0 is higher than the reference voltage Vref, outputs the HIGH level, and, when the voltage is lower than the reference voltage Vref, outputs the LOW level. Similarly, a sense amplifier SA1 compares a voltage at a match line ML1 in Segment 1 with the reference voltage Vref, and, when the voltage at the match line ML1 is higher than the reference voltage Vref, outputs the HIGH level, and, when the voltage is lower than the reference voltage Vref, outputs the LOW level. The same holds true for sense amplifiers SA2, SA3, ... of other segments (not shown).

An output of the sense amplifier acts as a control signal for a power switch and a sense amplifier of the next segment. For example, an output of the sense amplifier SA0 acts as a control signal for the power switch SW1 and the sense amplifier SA1. The same holds true for sense amplifiers SA1, SA2, .... An output of a sense amplifier in the last segment indicates whether or not a part of storage data stored in the word including those segments 0, 1, ... and a part of search data corresponding to the storage data are matched.

Figure 3:
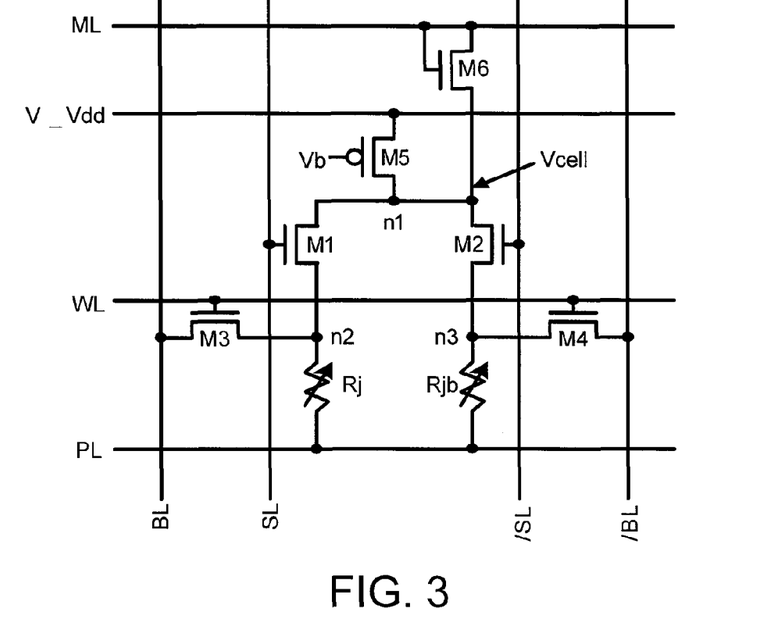
FIG. 3 is a circuit diagram illustrating an exemplary nonvolatile CAM cell.

FIG. 3 illustrates an exemplary nonvolatile CAM cell in this embodiment. This CAM cell includes a comparator circuit including a pair of magnetic tunnel junction elements (MTJ elements), transport means for transporting a comparison result to the match line, and current switches for supplying a write current to the MTJ elements. The comparator circuit includes transistors M1, M2, and M5 and a pair of MTJ elements Rj and Rjb. The transport means includes a diode-connected transistor M6. Transistors M3 and M4 are the current switches.

In the comparator circuit described above, a gate of the transistor M1 is connected to a search line SL, and a gate of the transistor M2 is connected to a search line/SL. One terminal of the MTJ element Rj is connected to a source terminal n2 of Ml, and one terminal of the MTJ element Rjb is connected to a source terminal n3 of M2. Further, M5 is a constant current source having a gate applied with a bias voltage Vb. A source terminal of M5 is connected to V_Vdd, and a drain terminal n1 thereof is connected to a drain terminal of M1 and a drain terminal of M2. Another terminal of the MTJ element Rj and another terminal of Rjb are both connected to a plate line PL.

With regard to the above-mentioned diode-connected transistor M6 serving as the transport means, a source terminal is connected to n1, and a drain terminal and a gate terminal are connected to a match line ML.

A word line WL is connected to gates of the transistors M3 and M4 serving as the above-mentioned current switches. Further, a source terminal of M3 is connected to a bit line BL and a drain terminal of M3 is connected to n2. Further, a source terminal of M4 is connected to a bit line /BL and a drain terminal of M4 is connected to n3. When searched data is written in the MTJ elements, by activating the word line to turn on M3 and M4, the write current can be supplied to the MTJ elements from the bit lines or the plate line.

Figure 4:
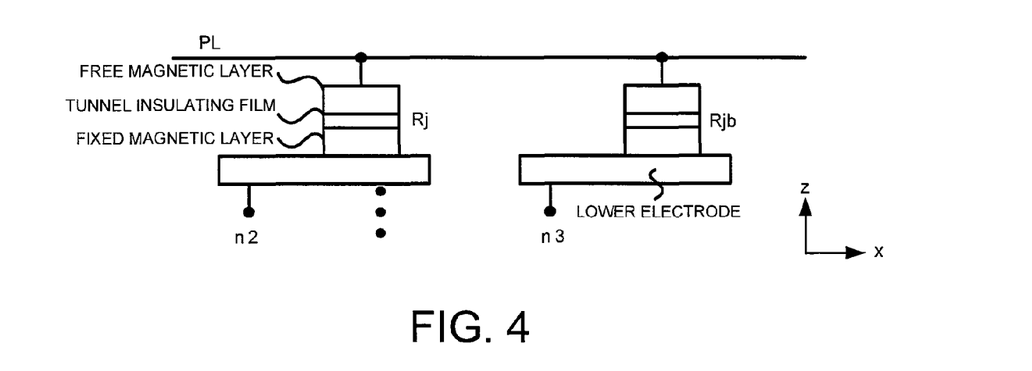
FIG. 4 is a sectional view of exemplary MTJ elements used in the nonvolatile CAM cell of FIG. 3.

FIG. 4 is a sectional view of the MTJ elements Rj and Rjb incorporated in this CAM cell. Those MTJ elements are formed of two magnetic layers insulated from each other by a tunnel film, and are formed in an interlayer film in a wiring process. A direction of magnetization of one magnetic layer (fixed magnetic layer) is fixed at the time of manufacture, and a direction of magnetization of another magnetic layer (free magnetic layer) can be changed by the write current supplied to the MTJ elements. When the free magnetic layer and the fixed magnetic layer are magnetized in the same direction, that is, in a parallel state, an MTJ element resistance between upper and lower electrodes is in a low resistance state ($R_L$). On the other hand, when the free magnetic layer and the fixed magnetic layer are magnetized in opposite directions, that is, in an anti-parallel state, the MTJ element resistance is in a high resistance state ($R_H$). Here, it is defined that, when the MTJ element resistance is in the low resistance state, data "0" is stored, and, when the MTJ element resistance is in the high resistance state, data "1" is stored. When "0" is written in the MTJ elements, by supplying a current of a predetermined value or larger in a direction from the free magnetic layer to the fixed magnetic layer, the magnetization makes a transition to the parallel state and the MTJ element resistance becomes the low resistance state. On the other hand, when "1" is written, by supplying a current of a predetermined value or larger in a direction from the fixed magnetic layer to the free magnetic layer, the magnetization makes a transition to the anti-parallel state and the MTJ element resistance becomes the high resistance state.

In this CAM cell, the two search lines SL and /SL are connected to the gates of the transistors M1 and M2, respectively, and one bit of data to be searched is complementarily input to SL and /SL. In search operation, one bit of storage data stored in the MTJ elements Rj and Rjb and search data input from SL and /SL are compared, and a comparison result is transported through the transistor M6 to the match line ML.

Figure 5:
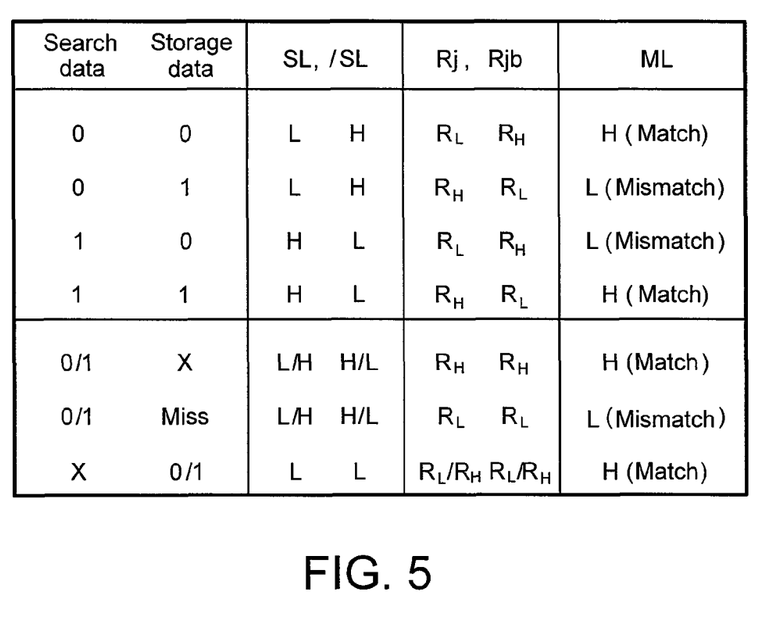
FIG. 5 is an operation truth value table of the nonvolatile CAM cell of FIG. 3.

FIG. 5 is a truth value table in the search operation of this CAM cell. When an arbitrary bit of the search data is "0" (the SL line is at the LOW level and the /SL line is at the HIGH level) and a corresponding bit of the storage data is "0" (Rj is in the low resistance state and Rjb is in the high resistance state), the transistor M2 is turned on so that Rjb in the high resistance state is selected, and the HIGH level (matched) is output to the match line ML. Further, when an arbitrary bit of the search data is "0" and a corresponding bit of the storage data is "1" (Rj is in the high resistance state and Rjb is in the low resistance state), Rjb in the low resistance state is selected, and the LOW level (mismatched) is output to ML. Further, when an arbitrary bit of the search data is "1" (the SL line is at the HIGH level and the /SL line is at the LOW level) and a corresponding bit of the storage data is "0" (Rj is in the low resistance state and Rjb is in the high resistance state), the transistor M1 is turned on so that Rj in the low resistance state is selected, and the LOW level (mismatched) is output to ML. Further, when an arbitrary bit of the search data is "1" and a corresponding bit of the storage data is "1" (Rj is in the high resistance state and Rjb is in the low resistance state), Rj in the high resistance state is selected, and the HIGH level (matched) is output to ML.

Further, in this CAM cell, a bit of the search data and a bit of the storage data can be "Don't Care". For example, by setting both the MTJ elements Rj and Rjb to be in the high resistance state, an arbitrary bit of the storage data can be set to be "Don't Care", and, regardless of whether the bit of the search data is "0" or "1", the HIGH level (matched) is output to ML. Further, by applying both the SL line and the /SL line with the LOW level, an arbitrary bit of the search data can be set to be "Don't Care", and, regardless of whether the bit of the storage data is "0" or "1", the HIGH level (matched) is output to ML.

Further, in this CAM cell, by setting both the MTJ elements Rj and Rjb to be in the low resistance state, "mismatched" can be compulsorily output.

Figure 6:
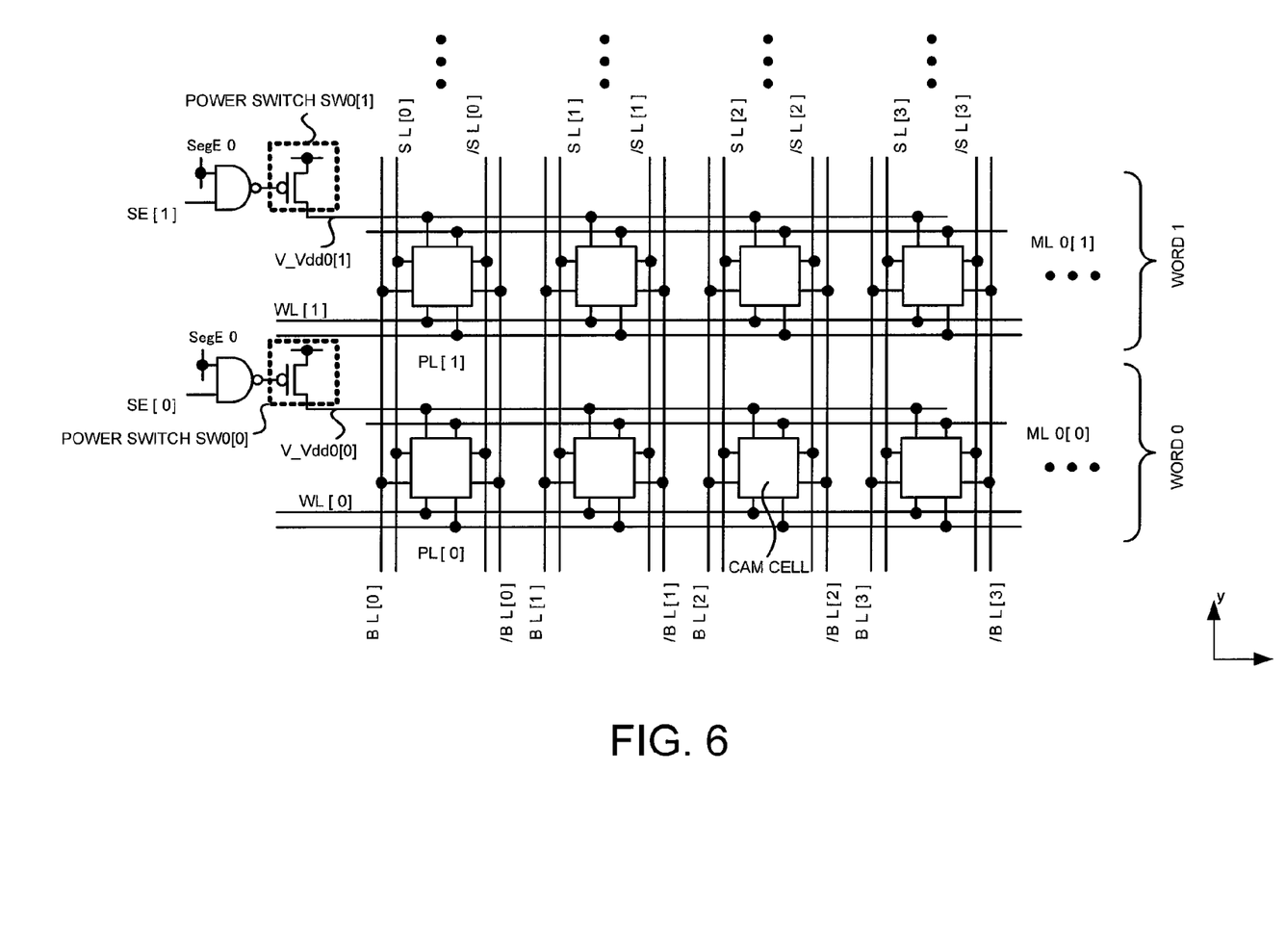
FIG. 6 is a circuit diagram of a cell array in the CAM according to the embodiment of this invention.

FIG. 6 is a circuit configuration diagram of an array of the nonvolatile CAM cells illustrated in FIG. 3 arranged in a matrix. Illustrated are only two lines of word circuits in Segment 0 (Segment 1, Segment 2, . . . are omitted). In this case, ML0[0] is a match line of Word 0 in Segment 0, and ML0[1] is a match line of Word 1 in Segment 0. Similarly, V_Vdd0[0] is a power line of Word 0 in Segment 0, and V_Vdd0[1] is a power line of Word 1 in Segment 0. A power switch SW0[0] is a power switch of Word 0 in Segment 0, and a power switch SW0[1] is a power switch of Word 1 in Segment 0.

Specifically, ML0[0] and V_Vdd0[0] are shared among CAM cells of Word 0 in Segment 0, and ML0[1] and V_Vdd0[1] are shared among CAM cells of Word 1 in the same segment. Further, ML0[0] is input to a sense amplifier SA0[0] (not shown) of Word 0 in Segment 0, and ML0[1] is input to a sense amplifier SA0[1] (not shown) of Word 1 in Segment 0. Further, V_Vdd0[0] is connected to the power switch SW0[0] of Word 0 in Segment 0, and V_Vdd0[1] is connected to the power switch SW0[1] of Word 1 in Segment 0.

In FIG. 6, WL[0] is a word line of Word 0, and WL[1] is a word line of Word 1. Similarly, PL[0] is a plate line of Word 0, and PL[1] is a plate line of Word 1. Specifically, a word line WL[i] and a plate line PL[i] extend in the X direction, and are each shared across segments of a word circuit (where i is the number of the word).

In FIG. 6, bit lines BL[j] and /BL[j] extend in a Y direction, and are each shared across words (where j is the number of the bit). Similarly, search lines SL[j] and /SL[j] extend in the Y direction, and are each shared across the words.

Figure 7:
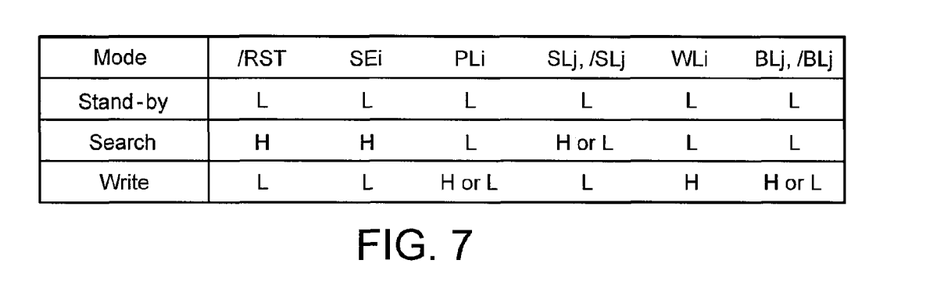
FIG. 7 is an operational mode truth value table of the CAM according to the embodiment of this invention.

FIG. 7 is an operation truth value table of the CAM in this embodiment. Operational modes of the CAM in this embodiment are described below with reference to the drawings. In this case, assume that the CAM cell array is, as illustrated in FIG. 1, segmented into four segments. Specifically, each of Word 0, 1, . . . is segmented into four segments: Segment 0, Segment 1, Segment 2, and Segment 3.

In a stand-by mode, a reset signal /RST is at the LOW level, and the states of all the sense amplifiers in the word circuit are initialized (cleared). At this time, the word line driver grounds all search enable signals SEi, the word lines WLi, and the plate lines PLi. Further, the bit line driver grounds all the bit lines BLi and /BLi. Further, the search line driver grounds all the search lines SLi and /SLi. In the stand-by mode, all SEi are in an inactivated state, and thus, all the power switches in the first segment are in an OFF state. Further, the sense amplifiers of the respective segments are cleared, and the clock signal SCLK for driving the respective sense amplifiers is not activated, and thus, all the power switches in the second and subsequent segments are also in the OFF state. Specifically, all the powers for the CAM cells are out of conduction.

Therefore, leakage current of the CAM cells, which is a main factor of stand-by power, is substantially zero. In this case, the storage data is held as resistance values of the MTJ elements of the respective CAM cells, and thus, is not lost even if the power is turned off.

Figure 8:
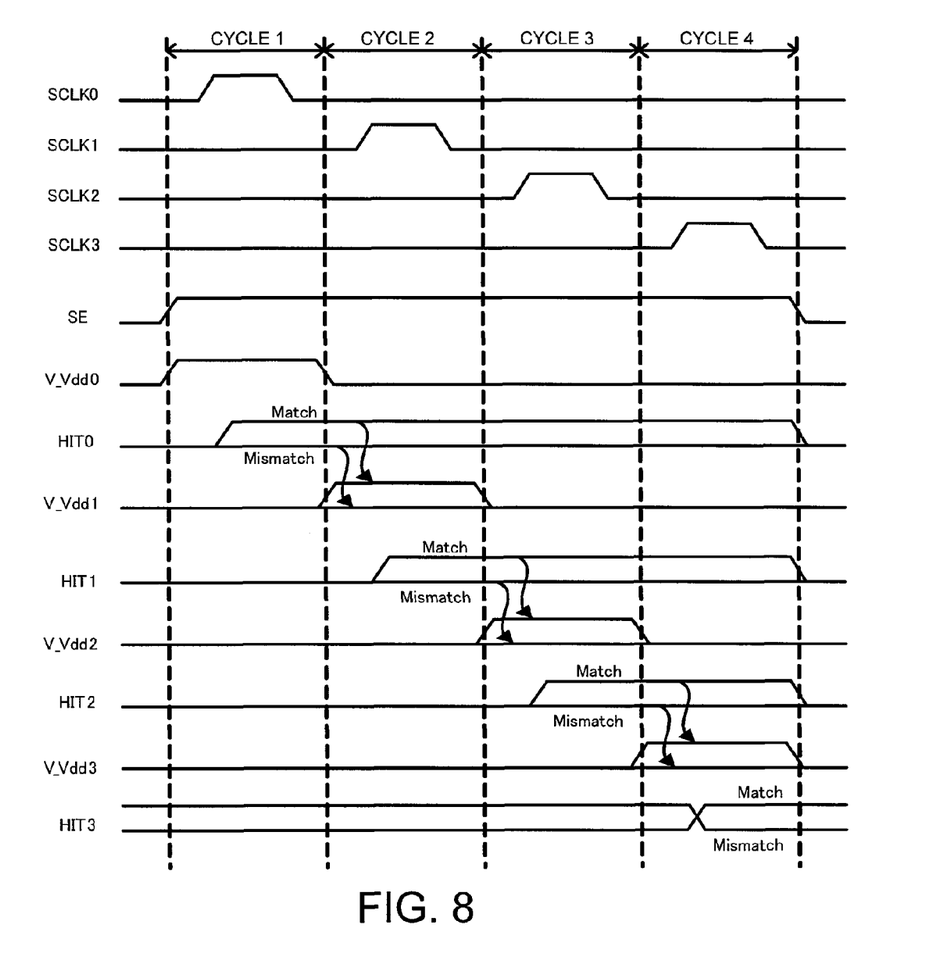
FIG. 8 is a timing chart of search operation of the CAM according to the embodiment of this invention.

Next, the search operation is described in detail with reference to a timing chart of FIG. 8. When a command for the search operation is input, the search operation is carried out through at least four cycles of sequential operation.

In Cycle 1, search operation in Segment 0 is started. First, a /RST signal is inactivated (HIGH level), and the sense amplifier is ready to operate through the SCLK signal. Further, the word line driver activates all the search enable signals SEi (HIGH level). Specifically, Segment 0 is in a selectable state. At this time, the search line driver applies the SLi line and the /SLi line with voltages in accordance with input search data and mask data. Note that, in the search operation, the word lines WLi and the bit lines BLi and /BLi remain in the grounded state. In Cycle 1, simultaneously with the activation of the SEi signals, a Segment 0 enable signal SegE0 is also activated, and power switches SW0[0], SW0[1], SW0[2], . . . in Segment 0 are turned on. At this time, in the respective CAM cells in Segment 0, operation of comparing the search data and the storage data is carried out. Only with regard to a word in which all the bits in Segment 0 are matched, a voltage at the HIGH level is output to the match line ML0 (matched). On the other hand, with regard to a word in which one or more bits are mismatched, a voltage at the LOW level is output to ML0 (mismatched).

Next, an SCLK0 signal is activated, and sense amplifiers SA0[0], SA0[1], SA0[2], . . . of the respective words compare the voltage at ML0 with the reference voltage Vref and amplify the result to have the logical amplitude. An output HIT0 of those sense amplifiers represents a result of a determination of matched/mismatched in Segment 0. Specifically, a word in which HIT0 is at the HIGH level is a word in which the bit in Segment 0 is matched, and a word in which HIT0 is at the LOW level is a word in which the bit in Segment 0 is mismatched. This result is held until operation in Cycle 4 as a last cycle is completed.

In Cycle 2, a Segment 1 enable signal SegE1 is activated, and search operation in Segment 1 is started. At this time, among power switches SW1[0], SW1[1], SW1[2], . . . in Segment 1, a power switch of the word in which HIT0 is at the HIGH level, that is, a power switch of the word in which all the bits in Segment 0 are determined to be matched is in an ON state. On the other hand, with regard to the word in which HIT0 is at the LOW level, that is, with regard to the word in which a bit in Segment 0 is determined to be mismatched, a power switch in Segment 1 of the word remains in the OFF state. Therefore, the comparing operation whether the bits in Segment 1 are matched/mismatched is carried out only with regard to the word in which the bits in Segment 0 are determined to be matched.

Next, an SCLK1 signal is activated, and, among sense amplifiers SA1[0], SA1[1], SA1[2], . . . in Segment 1, only a sense amplifier of the word in which the HIT0 signal is at the HIGH level, that is, of the word in which the Segment 1 is in an activated state operates. The activated sense amplifier compares the voltage at ML1 with Vref, and amplifies the result to have the logical amplitude. An output HIT1 of those sense amplifiers represents a result of a determination of matched/mismatched in Segment 1, and this result is held until the operation in last Cycle 4 is completed. In this case, with regard to the word in which the HIT0 signal is at the LOW level, that is, Segment 1 is in an operation stop state, the output HIT1 of the sense amplifier remains fixed to the LOW level, which is equivalent to a state of being determined to be mismatched.

In Cycle 3, a Segment 2 enable signal SegE2 is activated, and search operation in Segment 2 is started. At this time, among power switches SW2[0], SW2[1], SW2[2], . . . in Segment 2, a power switch of the word in which HIT1 is at the HIGH level, that is, a power switch of the word in which all the bits in Segment 1 are determined to be matched is in an ON state. On the other hand, with regard to the word in which HIT1 is at the LOW level, that is, with regard to the word in which a bit in Segment 1 is determined to be mismatched, a power switch in Segment 2 of the word remains in the OFF state. Therefore, the comparing operation whether the bits in Segment 2 are matched/mismatched is carried out only with regard to the word in which the bits in Segment 1 are determined to be matched. Thereafter, similarly to the case of Cycle 2, only a sense amplifier of the word in which Segment 2 is activated operates, and, as an output signal HIT2 thereof, a result of a determination of matched/mismatched is output.

In Cycle 4, a Segment 3 enable signal SegE3 is activated, and search operation in Segment 3 is started. At this time, among power switches SW3[0], SW3[1], SW3[2], . . . in Segment 3, a power switch of the word in which HIT2 is at the HIGH level, that is, a power switch of the word in which all the bits in Segment 2 are determined to be matched is in an ON state. On the other hand, with regard to the word in which HIT2 is at the LOW level, that is, with regard to the word in which a bit in Segment 2 is determined to be mismatched, a power switch in Segment 3 of the word remains in the OFF state. Therefore, the comparing operation whether the bits in Segment 3 are matched/mismatched is carried out only with regard to the word in which the bits in Segment 2 are determined to be matched.

Thereafter, similarly to the cases of Cycle 2 and Cycle 3, only a sense amplifier of the word in which Segment 3 is activated operates, and, as an output signal HIT3 thereof, a final result of a determination of matched/mismatched is output. Specifically, a word in which HIT3 at the HIGH level is output is a word that is determined to be matched, and a word in which HIT3 at the LOW level is output is a word that is determined to be mismatched. In Cycle 4, the address encoder outputs address information of matched words under a state in which HIT3 signals of all the words are the input.

Figure 9:
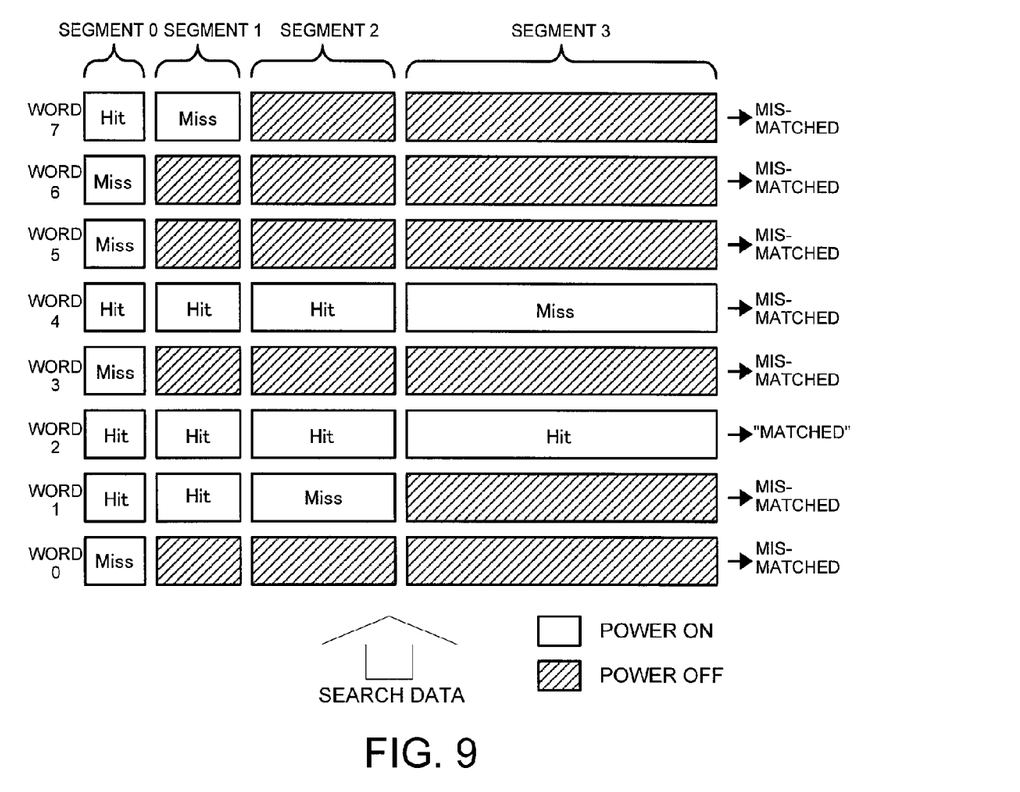
FIG. 9 illustrates exemplary power control in the search operation of the CAM according to the embodiment of this invention.

FIG. 9 schematically illustrates exemplary power control in the search operation in the CAM of this embodiment. In FIG. 9, for the sake of convenience of description, only eight words are illustrated, but actually, several thousand to several million words are generally included in the structure. In FIG. 9, white blocks represent portions in which the power is in the ON state, and hatched blocks represent portions in which the power is in the OFF state. As described above, bit comparison is made in sequence from Segment 0, and thus, in Segment 0, all the powers are in the ON state. In Segment 1, the power is in the ON state only with regard to a word that is determined to be matched in Segment 0. For example, this applies to Words 1, 2, 4, and 7. In Segment 2, the power is in the ON state only with regard to a word that is determined to be matched in Segment 1. For example, this applies to Words 1, 2, and 4. In Segment 3, the power is in the ON state only with regard to a word that is determined to be matched in Segment 2. For example, this applies to Word 2 and Word 4. Here, Word 2 is determined to be matched, while Word 4 is determined to be mismatched. It follows that, finally, only Word 2 is determined to be matched, and the address encoder outputs an address of Word 2 as a search result.

Figure 10:
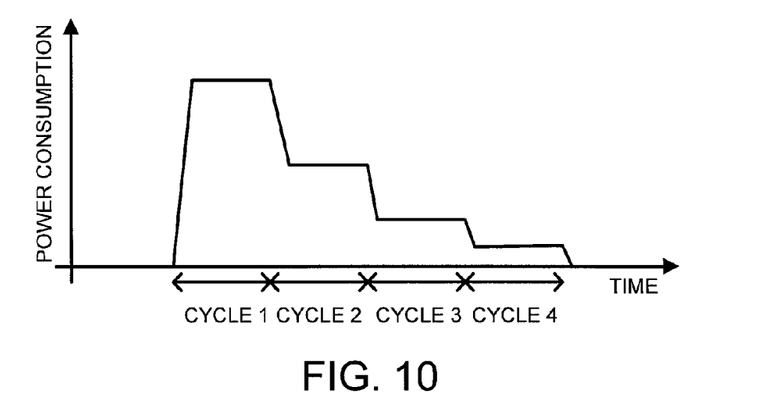
FIG. 10 shows power consumption over time in the search operation of the CAM according to the embodiment of this invention.

FIG. 10 schematically shows power consumption over time in the respective cycles. In Cycle 1, all the words operate, and thus, the power consumption is at the maximum, but, as the cycle proceeds to Cycle 2, Cycle 3, and Cycle 4, the number of words that operate reduces and the power consumption reduces.

In this embodiment, the number of bits that each of the divided segments has is arbitrary. For example, consider a case in which a word having 128 bits is divided into four segments. As is clear from FIG. 9, in Segment 0 in which the comparing operation is carried out first, all the words operate, and thus, it is desired from the viewpoint of reducing a peak current that a smaller number of bits be assigned thereto than those to other segments.

Next, operation in a write mode in which the searched data is written in an MTJ element in a CAM cell is described. From the operation truth value table of FIG. 7, in the write mode, one selected word line WLi corresponding to an address signal that is input from the outside is activated (HIGH level), and a voltage that is determined by data input that is input from the outside and the mask data is applied to the bit lines BLj and /BLj. This write mode is carried out in two steps for each of the words. In the first step, a selected plate line PLi is grounded to the LOW level, and writing in an MTJ element that is required to be in the high resistance state is carried out. In the next second step, the selected plate line PLi is pulled up to the HIGH level, and writing in an MTJ element that is required to be in the low resistance state is carried out. At this time, all word lines and plate lines that are not selected are grounded, and all the search lines are also grounded. Operation is specifically described in detail in the following.

In the write mode, the word line driver has the function of applying a voltage at the HIGH level to one selected word line corresponding to an address input that is input from the outside to activate the word line, and of applying a voltage at the LOW level to word lines that are not selected to inactivate the word lines.

In the write mode, the bit line driver also has the function of generating a signal to be applied to the respective bit lines from data input that is input from the outside and the mask data. If the mask bit is "0" with regard to an arbitrary data bit j (not masked), complementary voltages are applied to the bit lines BLj and /BLj in accordance with the data bit. For example, when the data bit is "0", a voltage at the LOW level is applied to BLj and a voltage at the HIGH level is applied to /BLj. When the data bit is "1", a voltage at the HIGH level is applied to BLj and a voltage at the LOW level is applied to /BLj. If the mask bit is "1" (masked), irrespective of the data bit, an identical voltage is applied to both the bit lines BLj and /BLj so that the pair of MTJ elements of the CAM cell concerned are both in the high resistance state (specifically, both BL and /BL are pulled up).

In the write mode, when one arbitrary word line WLi is activated, the transistors M3 and M4 of the CAM cell of the selected word are turned on. Specifically, there is continuity between an internal node n2 and the bit line BL, and there is continuity between n3 and /BL. At this time, by appropriately controlling voltages at the bit lines BL and /BL and the plate line PL, arbitrary data can be written in the two MTJ elements in the CAM cell. For example, when "1" is written in the MTJ element Rj, this can be carried out by applying a voltage at the LOW level to the plate line PL and applying a voltage at the HIGH level to the bit line BL. At this time, a current flows through the MTJ element Rj in a direction from a lower electrode (n2) to an upper electrode (PL), and Rj is in the high resistance state. On the other hand, when "0" is written in the MTJ element Rj, this can be carried out by applying a voltage at the HIGH level to the plate line PL and applying a voltage at the LOW level to the bit line BL. At this time, a current flows through the MTJ element Rj in a direction from the upper electrode (PL) to the lower electrode (n2), and Rj is in the low resistance state. When an identical potential is applied to the plate line and the bit line, no potential difference is caused across the MTJ element Rj, and thus, the write current is not supplied and data is not rewritten. With regard also to the another MTJ element Rjb, the stored data can be rewritten in a similar method of applying a potential difference between the plate line and the bit line /BL.

According to this embodiment described above, in the search operation, the power of a CAM cell in which no bit comparison is required to be made can be efficiently turned off, and unnecessary consumption of operating power can be inhibited. This can be realized by using a nonvolatile CAM that can hold storage data even if the power is turned off, but cannot be realized by using a related-art volatile SRAM-based CAM cell. Further, there is also a function of turning off the power of all the CAM cells during stand-by, and thus, the stand-by power can be significantly reduced.

Further, reduction of area cost of the CAM cell to ½ or less can also be expected. For example, in the CAM cell illustrated in FIG. 3, six transistors and two MTJ elements are used. MTJ elements can be physically formed on a transistor, and thus, practically, the cell area is required for the six transistors. In a related-art SRAM-based CAM cell, fourteen to sixteen transistors are necessary. Therefore, the cell area cost can be reduced to about ½ to ⅓. Therefore, a CAM having a larger capacity with lower power consumption than hitherto can be realized.

(Second Embodiment)

A second embodiment of this invention is different from the first embodiment in that a dedicated segment for enabling or disabling a word to be searched is added. Other basic circuit structures and operation of the CAM cell are similar to those in the first embodiment, and description thereof is omitted.

When the number of the searched words does not exceed the number of words in a CAM macro that is physically prepared (in a hardware manner), by introducing a mechanism for preventing bit-comparing operation with regard to an empty word, the operating power can be further reduced. This can be carried out by, for example, in the first embodiment, with regard to a word not to be searched, writing a pattern to be compulsorily determined to be mismatched in the MTJ elements in an arbitrary bit in Segment 0 where the bit comparison is made first. Specifically, both the MTJ elements Rj and Rjb only need to be set in the low resistance state. This procedure to compulsorily make a determination of mismatched can be carried out with only one bit, but, when Segment 0 includes a plurality of bits, power consumed by comparing operation in the remaining bits is vain.

Figure 11:
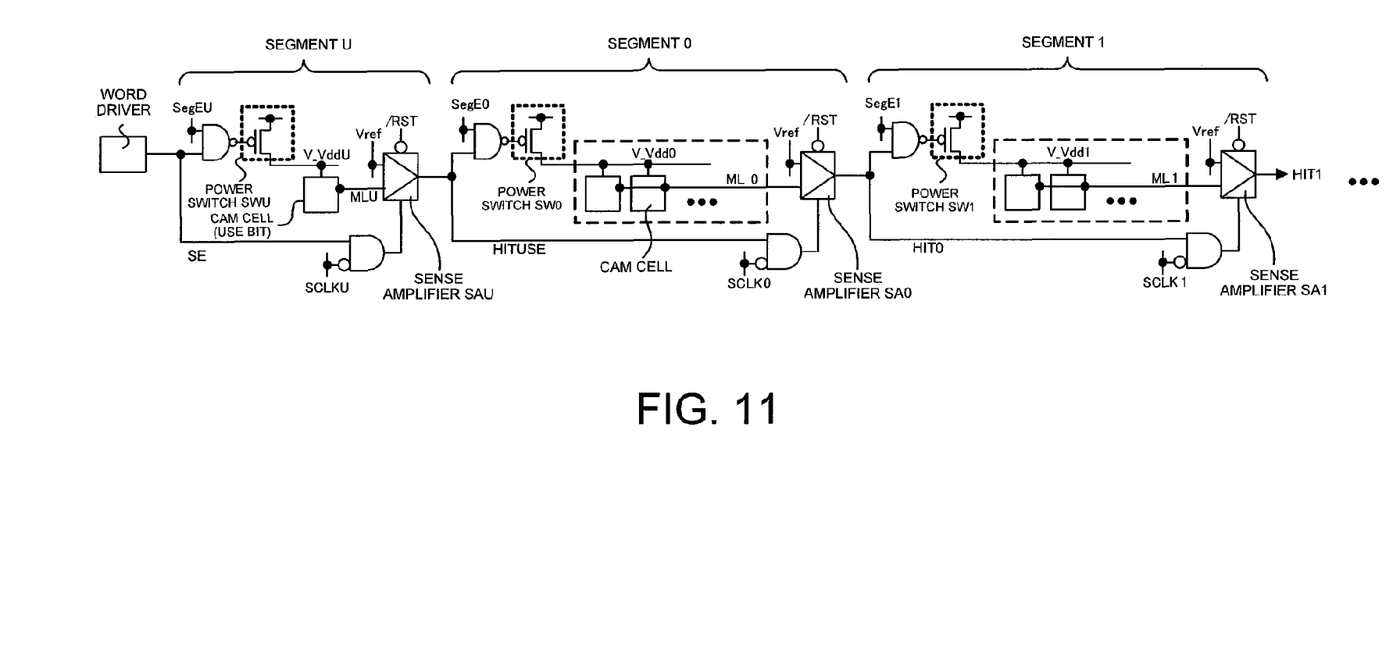
FIG. 11 is a block diagram illustrating a structure of a word circuit in a CAM according to a second embodiment of this invention.

FIG. 11 illustrates a basic structure of a word circuit in a CAM according to this embodiment, and each of the words includes dedicated Segment U for designating whether the word is to be searched or not. Segment U includes a CAM cell of one bit, a power switch SWU therefor, and a sense amplifier SAU. Further, Segment U is provided between the word line driver and Segment 0, and a search enable signal SEi supplied by the word line driver is input to the power switch SWU and the sense amplifier SAU. An output HITUSE signal of the sense amplifier SAU represents whether the word is enabled or disabled. Specifically, when HITUSE is at the HIGH level, the word is enabled, and, when HITUSE is at the LOW level, the word is disabled.

In each of the words, values are written in the MTJ elements Rj and Rjb in the CAM cell in Segment U as in the following. When the word is to be searched, in this CAM cell, values are written so that both the MTJ elements Rj and Rjb are in the high resistance state. This case corresponds to "Don't Care" in the truth value table of FIG. 5, and, irrespective of the search data, a determination of matched is made. On the other hand, when the word is not to be searched, values are written so that both the MTJ elements Rj and Rjb are in the low resistance state. In this case, irrespective of the search data, a determination of mismatched is compulsorily made. Note that, a method of the input to the search line corresponding to Segment U (voltage to be applied thereto) is arbitrary.

Figure 12:
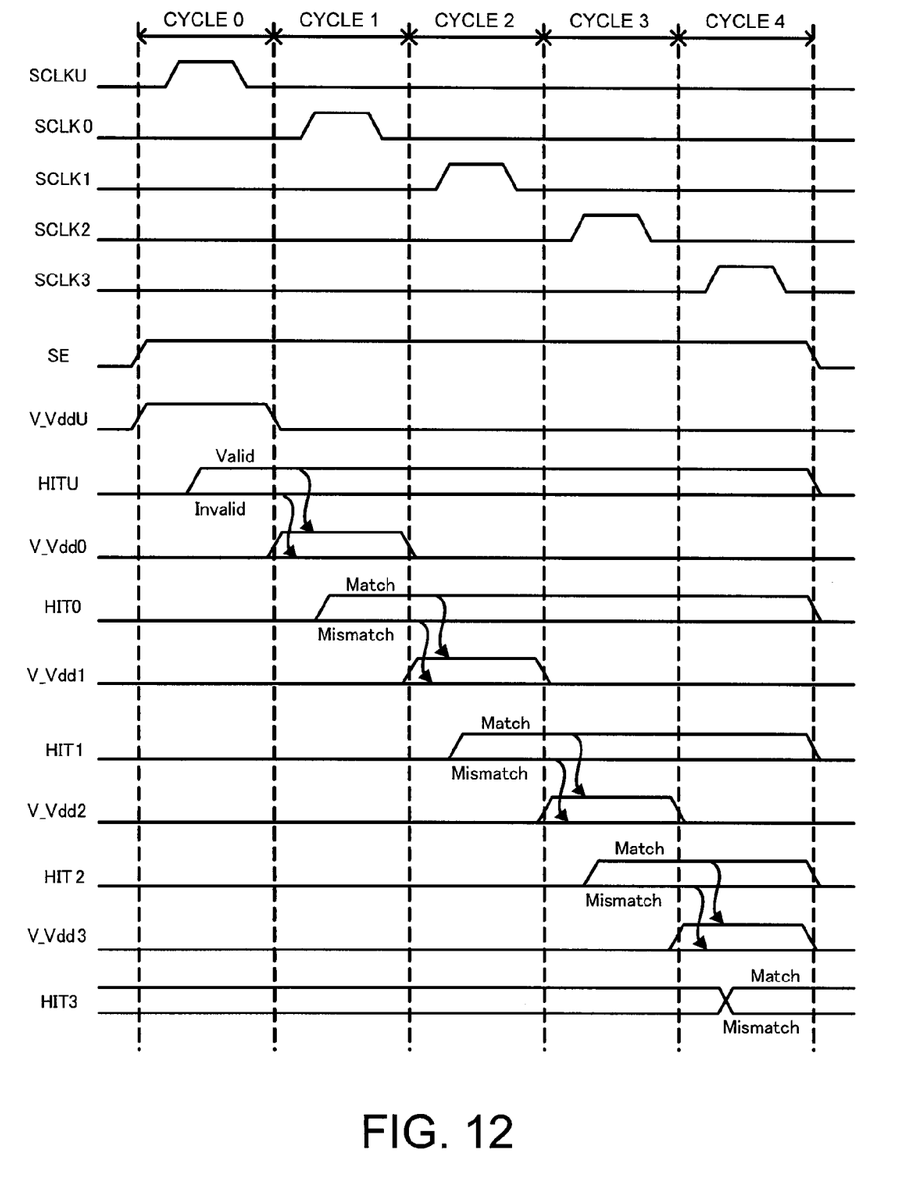
FIG. 12 is a timing chart of search operation of the CAM according to the second embodiment of this invention.

As illustrated in FIG. 12, in this embodiment, in Segment U, first, in Cycle 1, bit-comparing operation of matched/mismatched is carried out. Next, in Cycle 2, bit-comparing operation of Segment 0 is carried out. If, in Cycle 1, the output HITUSE signal is at the HIGH level, this word is a word to be searched. Therefore, next, in Cycle 2, the power switch in Segment 0 is turned on, and the sense amplifier makes a determination of matched/mismatched. On the other hand, if the output HITUSE signal is at the LOW level, this word is not a word to be searched. Therefore, next, in Cycle 2, the power switch SW0 in Segment 0 is still turned off, and the operation of the sense amplifier SA0 is suspended. Note that, operation in Cycle 2 and subsequent cycles is similar to that in the first embodiment, and thus, specific description thereof is omitted.

Figure 13:
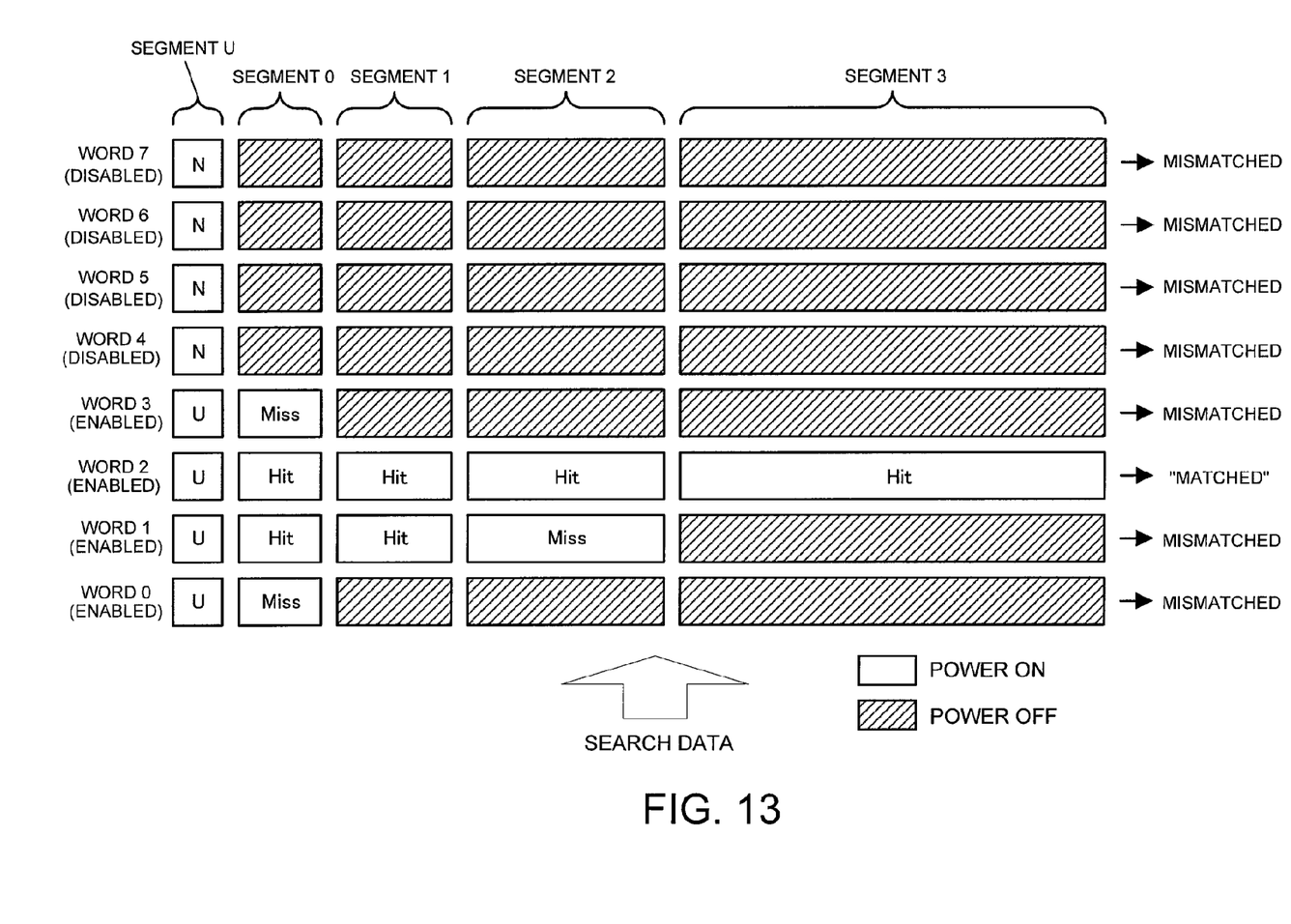
FIG. 13 illustrates exemplary power control in the search operation of the CAM according to the second embodiment of this invention.

FIG. 13 schematically illustrates exemplary power control in the search operation in the CAM of this embodiment. In FIG. 13, for the sake of convenience of description, only eight words are illustrated, but actually, several thousand to several million words are generally included in the structure. In FIG. 13, white blocks represent portions in which the power is in the ON state, and hatched blocks represent portions in which the power is in the OFF state. Further, Words 0 to 3 are words to be searched, and Words 4 to 7 are words not to be searched. As described above, bit comparison is made in sequence from Segment U, and thus, in Segment U, all the powers are in the ON state. In Segment 0, the power is in the ON state only with regard to a word that is determined to be matched in Segment U, that is, only with regard to an enabled word. For example, this applies to Words 0 to 3. In Segment 1, the power is in the ON state only with regard to a word that is determined to be matched in Segment 0. For example, this applies to Words 1 and 2. In Segment 2, the power is in the ON state only with regard to a word that is determined to be matched in Segment 1. For example, this applies to Word 1 and Word 2. In Segment 3, the power is in the ON state only with regard to a word that is determined to be matched in Segment 2. For example, this applies to Word 2. Here, Word 2 is determined to be matched. It follows that, finally, only Word 2 is determined to be matched, and the address encoder outputs an address of Word 2 as a search result.

According to this embodiment, unless the storage data is filled with all the words, an effect of reducing the operating power than that of the first embodiment can be obtained. Note that, insofar as no contradiction arises, this embodiment may be combined with the embodiment already described above. For example, this embodiment can be applied to a case in which a CAM includes a redundant word for remedying a faulty bit or a faulty word. In this case, by applying this embodiment, without including a peripheral circuit for generating a signal to stop operation of a word to be replaced (faulty word), the word can be exempted from words to operate.

The embodiments of this invention have been described above with reference to the attached drawings. However, it goes without saying that this invention is not limited to those embodiments and various modifications can be made thereto by those skilled in the art without departing from the gist of this invention.

For example, in the embodiments described above, a magnetoresistive element is used as a nonvolatile storage element of a memory cell, but it would be apparent to those skilled in the art that this invention may also be applied to a phase change element, an atomic movement controlled element, an oxygen deficient variable resistance element, a metal bridge forming variable resistance element, or other variable resistance elements, or, other types of nonvolatile storage elements.

The invention claimed is:

1. A nonvolatile content addressable memory configured to compare search data that is input from an outside with storage data that is stored in advance,
    the nonvolatile content addressable memory comprising a plurality of word circuits, each of the plurality of word circuits comprising a plurality of segments having an order relation, each of the plurality of segments comprising one or more memory cells, each of the one or more memory cells comprising a nonvolatile storage element,
    the each of the plurality of segments comprising power switch means for turning on/off a power of a memory cell of the segment,
    wherein, during stand-by, all the power switch means are turned off, and
    wherein, in search operation, the power switch means is turned on as necessary for each of the plurality of segments.

2. A nonvolatile content addressable memory according to claim 1,
    wherein the each of the plurality of segments further comprises a sense amplifier configured to compare storage segment data stored in the memory cell of the segment as a part of the storage data and search segment data corresponding to the storage segment data as a part of the search data to make a determination of any one of matched and mismatched,
    wherein a determination by the sense amplifier is made for each of the plurality of segments in an order of the order relation in each of the plurality of word circuits, and
    wherein the power switch means turns on, only when all the sense amplifiers that belong to segments prior to the segment of the power switch means in the order relation make a determination of matched, the power of the memory cell of the segment.

3. A nonvolatile content addressable memory according to claim 1,
    wherein the each of the plurality of word circuits comprises a first segment and a second segment immediately after the first segment in the order relation, and
    wherein the first segments of the plurality of word circuits operate in synchronization with one another, and the second segments of the plurality of word circuits operate in synchronization with one another.

4. A nonvolatile content addressable memory according to claim 1,
    wherein the each of the plurality of word circuits comprises a first segment and a second segment immediately after the first segment in the order relation,
    wherein the power switch means of the second segment inputs an output signal of a sense amplifier of the first segment and a control signal for enabling the search operation in the second segment, and wherein, only when the output signal and the control signal have a combination of predetermined values, the power switch means of the second segment is turned on.

5. A nonvolatile content addressable memory according to claim 1,
wherein the each of the plurality of word circuits comprises a first segment and a second segment immediately after the first segment in the order relation,
wherein a sense amplifier of the second segment inputs an output signal of a sense amplifier of the first segment and a control signal for enabling the search operation in the second segment, and
wherein, only when the output signal and the control signal have a combination of predetermined values, the sense amplifier of the second segment compares storage segment data stored in the memory cell of the segment as a part of the storage data and search segment data corresponding to the storage segment data as a part of the search data to make a determination of any one of matched and mismatched.

6. A nonvolatile content addressable memory according to claim 1,
wherein the each of the one or more memory cells is capable of storing any one of four different states: "Data 0"; "Data 1"; "Don't Care"; and "compulsorily mismatched",
wherein, when "Don't Care" is stored, the each of the one or more memory cells outputs, irrespective of the search data that is input to the each of the one or more memory cells, a voltage equivalent to "matched", and
wherein, when "compulsorily mismatched" is stored, the each of the one or more memory cells outputs, irrespective of the search data that is input to the each of the one or more memory cells, a voltage equivalent to "mismatched".

7. A nonvolatile content addressable memory according to claim 6, wherein the each of the one or more memory cells comprises two nonvolatile storage elements each of which is capable of storing any one of two different states, and, through a combination of outputs of the two nonvolatile storage elements, stores the four different states.

8. A nonvolatile content addressable memory according to claim 6,
wherein the each of the plurality of word circuits comprises a first segment and a second segment immediately after the first segment in the order relation,
wherein a predetermined bit to be stored in a memory cell that belongs to the first segment is assigned as a bit for representing whether the second segment is enabled or disabled,
wherein, when the bit represents that the second segment is enabled, the bit is set in a state of "Don't Care", and
wherein, when the bit represents that the second segment is disabled, the bit is set in a state of "compulsorily mismatched".

9. A nonvolatile content addressable memory according to claim 1, wherein the nonvolatile storage element comprises any one of a magnetoresistive element, a phase change element, an atomic movement controlled element, an oxygen deficient variable resistance element, a metal bridge forming variable resistance element, and other variable resistance elements.

10. A method of operating a nonvolatile content addressable memory configured to compare search data that is input from an outside with storage data that is stored in advance, the method comprising, when each of a plurality of word circuits included in the nonvolatile content addressable memory is divided into a plurality of segments each comprising one or more memory cells and having an order relation in each of the plurality of word circuits:
a stand-by step of turning off all powers of the plurality of segments during stand-by; and
a searching step of turning on the power as necessary for each of the plurality of segments in search operation.

11. A method of operating a nonvolatile content addressable memory according to claim 10, wherein, when one of the plurality of segments is referred to as a first segment and a segment that is another one of the plurality of segments and that is immediately after the first segment in the order relation is referred to as a second segment, the searching step comprises the steps of:
comparing, in each of the first segment and all segments prior to the first segment in the order relation, that is, segments that are the first segment and all segments prior thereto, a part of the storage data stored in the memory cell of the segment with a part of the search data corresponding to the part of the storage data to make a determination of any one of matched and mismatched; and
turning on, only when all determinations in the segments that are the first segment and all segments prior thereto are matched, a power of the memory cell of the second segment.

12. A method of operating a nonvolatile content addressable memory according to claim 10, wherein the first segments of the plurality of word circuits make a first one of the determination in synchronization with one another, and the second segments of the plurality of word circuits make a second one of the determination in synchronization with one another.

13. A method of operating a nonvolatile content addressable memory according to claim 10, wherein, only when a signal representing a result of the determination in the first segment and a control signal for enabling the search operation in the second segment have a combination of predetermined values, the power of the memory cell of the second segment is turned on.

14. A method of operating a nonvolatile content addressable memory according to claim 10, wherein, only when a signal representing a result of the determination in the first segment and a control signal for enabling the search operation in the second segment have a combination of predetermined values, a part of the storage data stored in the memory cell of the second segment and a part of the search data corresponding to the part of the storage data are compared to make a determination of any one of matched and mismatched.

15. A method of operating a nonvolatile content addressable memory according to claim 10,
wherein the each of the one or more memory cells is capable of storing any one of four different states: "Data 0"; "Data 1"; "Don't Care"; and "compulsorily mismatched",
wherein, when "Don't Care" is stored, the each of the one or more memory cells outputs, irrespective of the search data that is input to the each of the one or more memory cells, a voltage equivalent to "matched", and
wherein, when "compulsorily mismatched" is stored, the each of the one or more memory cells outputs, irrespective of the search data that is input to the each of the one or more memory cells, a voltage equivalent to "mismatched".

16. A method of operating a nonvolatile content addressable memory according to claim 15, wherein the each of the one or more memory cells comprises two nonvolatile storage elements each of which is capable of storing any one of two different states, and, through a combination of outputs of the two nonvolatile storage elements, stores the four different states.

17. A method of operating a nonvolatile content addressable memory according to claim 15,
wherein a predetermined bit to be stored in a memory cell that belongs to the first segment is assigned as a bit for representing whether the second segment is enabled or disabled,
wherein, when the bit represents that the second segment is enabled, the bit is set in a state of "Don't Care", and
wherein, when the bit represents that the second segment is disabled, the bit is set in a state of "compulsorily mismatched".

18. A method of operating a nonvolatile content addressable memory according to claim 10, wherein the nonvolatile storage element comprises any one of a magnetoresistive element, a phase change element, an atomic movement controlled element, an oxygen deficient variable resistance element, a metal bridge forming variable resistance element, and other variable resistance elements.

* * * * *